United States Patent [19]

Baeuerle

[11] Patent Number: 4,666,552
[45] Date of Patent: May 19, 1987

[54] ETCHING METHOD FOR BODIES OF DIELECTRIC OXIDE CERAMIC

[76] Inventor: Dieter Baeuerle, Oberklammer Str. 47, A4203 Altenberg/Linz, Austria

[21] Appl. No.: 778,536

[22] Filed: Sep. 20, 1985

[30] Foreign Application Priority Data

Oct. 9, 1984 [DE] Fed. Rep. of Germany ....... 3437056

[51] Int. Cl.$^4$ ............................................. B44C 1/22
[52] U.S. Cl. ................................... 156/643; 156/663; 219/121 LJ
[58] Field of Search .............. 156/643, 644, 653, 663; 219/121 LJ

[56] References Cited

U.S. PATENT DOCUMENTS

| | | | |
|---|---|---|---|
| 3,364,087 | 1/1968 | Solomon et al. | 156/643 |
| 3,601,576 | 8/1971 | Schlafli | 219/121 LJ |
| 4,490,211 | 12/1984 | Chen et al. | 156/643 |

FOREIGN PATENT DOCUMENTS 0013345 9/1982 European Pat. Off. .
1901524 8/1969 Fed. Rep. of Germany .

OTHER PUBLICATIONS

J. Addy, T. J. Chuang and F. A. Houle, IBM Technical Disclosure Bulletin, vol. 25, No. 7A, Dec., 1982.
von Gutfeld et al, App. Phys. Lett. 40(4), Feb. 15, 1982, pp. 352–354.
R. Remund, Elektronik Produktion & Pruftechnik, May, 1982, pp. 347–353.

Primary Examiner—Robert Lindsay
Attorney, Agent, or Firm—Hill, Van Santen, Steadman & Simpson

[57] ABSTRACT

The etching of dielectric oxide ceramics and dielectric single crystal oxides, particularly perovskite ceramics, is executed by means of laser radiation in an atmosphere having a reducing effect.

12 Claims, 1 Drawing Figure

U.S. Patent    May 19, 1987    4,666,552
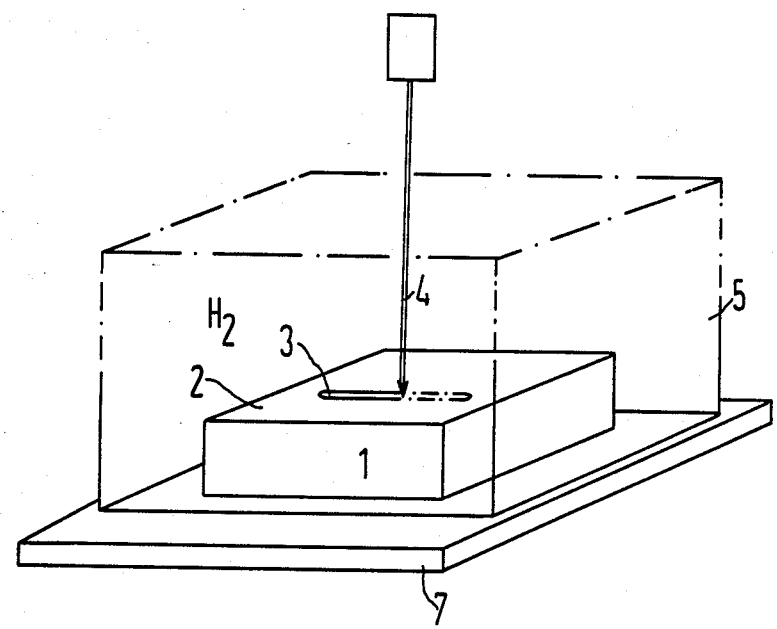

4,666,552

ETCHING METHOD FOR BODIES OF DIELECTRIC OXIDE CERAMIC

BACKGROUND OF THE INVENTION

1. Field of the Invention

This invention lies in the field of surface etching methods using laser radiation for dielectric oxide ceramics and dielectric single crystal oxides.

2. Prior Art

It is known that materials can be worked with laser radiation. Such working can involve etching, cutting or drilling. As a rule, the function of the laser radiation upon the material being worked is to remove a portion of such material in a manner comparable to an etching operation wherein the removed material is highly heated and burns at least in part in a surrounding oxygen atmosphere.

U.S. Pat. No. 3,601,576 discloses drilling of certain crystals with pulsed laser radiation for clocks. This laser beam processing ensues in an oxidizing, a reducing, or in a neutral atmosphere. An oxidizing atmosphere is preferred. Under the conditions provided the crystal can be heated before being subjected to the laser beam working.

IBM Technical Disclosure Bulletin, Vol. 25, No. 7a (December 1982), page 3256, discloses the etching of ferrite material with laser radiation in a halomethane gas atmosphere. Carbon tetrachloride, carbon tetrafluoride and sulfur hexafluoride are also employed instead of the halomethane gas. Obviously, the halogen content in the atmosphere is critical for the known working of the ferrite material with laser radiation.

Applied Physics Letters, Vol. 40 (1982), pages 352–354, discloses the working of some ceramic materials with laser radiation in addition to silicon. The chosen starting material is submersed in an aqueous potassium hydroxide solution for intensifying the etching effect. An aluminum oxide/titanium carbide ceramic is specified as specific material. Just as in the method of the publication cited above, a liquid, or, alternatively, a gas which has aggressive property with respect to circuit structures and the like and which is already present on the material to be processed is allowed to influence such material during the processing. For example, a fine interconnect structure already present on the material to be processed is negatively influenced by a halogen atmosphere or a caustic solution.

Elektronik Produktion und Prüftechnik (May 1982), pages 347–353, specifies various processing methods, suitable for example, for ceramic substrates among others, wherein laser radiation is employed. A compressed air stream and/or an extraction are provided therein, principally in order to protect the optical parts of the apparatus against particles which are hurled off when the substrate material is scored, cut, drilled.

The published European Patent application No. 00 13 345 discloses the employment of argon ion lasers for processing operations in semiconductor technology.

The German OS No. 19 01 524 discloses the processing of semiconductor material, particularly silicon, by laser beam heating, principally in an atmosphere which contains a volatile compound. The atmosphere provided for this purpose serves the purpose of oxidizing the silicon to form, for example, hydrosilicon (SiH$_4$). Hydrogen is present as a carrier gas for achieving good thermal conduction without the oxidation of the silicon provided in this method being noticibly impeded due to this gas. The hydrogen becomes an inert gas therein and is equated with the employment of nitrogen or other inert gas.

Internal experiments have been undertaken with the aim of providing a method of etching with laser radiation a material such as a dielectric oxide ceramic, or, alternatively, dielectric oxide crystals, particularly single-crystals, whereby a perovskite material especially is involved. It is thus a matter, for example, of using barium titanate, strontium titanate, lead zirconate titanate, and the like, that is, principally dielectric materials which have wide-spread application in electronics, particularly for piezo-electric bodies as well. The results of the numerous experiments carried out were completely unsatisfactory and these results likewise did not allow any conclusions that such an etching could lead to a satisfactory result at all for bodies of such a material.

BRIEF SUMMARY OF THE INVENTION

More particularly, the present invention relates to a method for etching structures in surface portions of a substrate body which can be a dielectric oxide ceramic, a dielectric single-crystal oxide, or the like which have functional utility as capacitor ceramics, piezo-electric elements, or the like. Such a body is moved relative to a laser processing beam impinged against such surface portions along a controlled path while maintaining such surface portions in an atmosphere having a reducing effect for the material comprising such body at elevated temperatures. The movement can be achieved, for example, by moving such body, by moving such laser beam, by a combination thereof, or the like.

A principle object of the present invention is to provide a technique by which an etching of material from surface portions of a dielectric oxide ceramic, or, alternatively, a dielectric single-crystal oxide can be successfully implemented upon application of laser radiation.

Other and further aims, objects, purposes, advantages, uses, and the like for the present invention will be apparent to those skilled in the art from the present invention.

BRIEF DESCRIPTION OF THE DRAWINGS

FIG. 1 is a diagrammatic illustration of one embodiment of apparatus suitable for carrying out the process of the present invention.

DETAILED DESCRIPTION

Quite in contrast to known erosive material working with laser radiation undertaken at least largely in an oxidizing atmosphere, the present invention provides that this working, which is preferably carried out at an elevated temperature, be implemented in an atmosphere which has a reducing effect upon the dielectric oxide material to be processed and to which the present invention pertains. It is surprising not only that such an etching is accomplished at all by the teachings of the present invention, but also that the results obtained are fully satisfactory. Hydrogen, at a partial pressure between 0 and about 1000 HPa, is preferably to be employed as the atmosphere coming into consideration for use in the invention as having a reducing effect for the oxide material. A hydrogen partial pressure of from about 50 through 100 HPa is especially suited particularly for ceramics, and, preferably, for lead zirconate titanate ceramics. The method of the invention can also be executed in a vacuum. A protective atmosphere composed of a mixture of nitrogen and hydrogen having a partial hydrogen pressure lying within the aforementioned range is also suitable.

For example, furrows or grooves can be etched into the bodies of the dielectric oxide materials employed here, particularly in ceramic bodies, and such an etching can be accomplished with relatively little tchnological outlay in comparison to other etching methods which are conceivable for ceramics. The good dimensional accuracy of the etching executed in accord with the present invention is particularly pointed out. For example, for lead zirconate titanate ceramic, a continuous laser with a power from about 0.5 through 2 watts is suitable given a spot diameter on the order of 5 to 50 $\mu$m, and a feed (or travel) rate of, for example, about 10 to 100 $\mu$m/s for the laser spot. Krypton ion lasers having a wavelength of about 647.1 nm were preferably employed for making embodiments using the process of the present invention.

Using, for example, the above-specified method parameters, furrow depths in lead zirconate titanate ceramic on the order of magnitude between 5 $\mu$m and 400 $\mu$m were capable of being produced in accord with the practices of the invention. The furrow depth and width was nearly constant. With respect to the ratio of the width to the depth of such a produced furrow, values on the order of about 1:10 could be achieved with very good reproducibility. Dimensional fluctuations lay at only a few $\mu$m once the method sequence had been set. Comparative tests between procedures using the method of the present invention, and a corresponding procedure which was carried out in air, show that the air procedure leads to entirely undefined results which can no longer be considered defined etching. In particular, in an air atmosphere, no coherent furrows could be achieved. Results that were worthy of consideration at least to a certain degree given laser beam processing in air could only be achieved given substantially greater laser radiation powers wherein, however, the dimensions of the furrows, particularly the depth and the width thereof, were highly different.

Ultraviolet, or visible laser radiation, for example, of an argon ion laser, or, alternatively, of a krypton ion laser, should be preferably employed for fine strips, for example, in the $\mu$m range. CO$_2$ lasers and Nd:YAG lasers are to be preferably employed for comparatively larger structures, for example, structures having dimensions in the mm range and/or for entire electrode surfaces. Barium titanate, strontium titanate and lead zirconate titanate, known as PZT, are preferably to be worked in accord with the invention, these materials having widespread applications in electronics as capacitor ceramics, or, alternatively, as ceramics for piezoelectric elements.

Armed with the perception of the invention described above, a person skilled in the art is in a position without further ado to identify optimum method parameters, for experimental as well as commercial usage for individual, respective dielectric oxide materials, whether such be ceramics or single crystals. Those skilled in the art will appreciate that the optimum values for a given set of method parameters also depend on the dimensions of the etched surface structures to be manufactured. For example, an auxiliary heating or, alternatively, a pre-heating of a starting body to be worked in accord with this invention can be accomplished up to a temperature above ambient extending to about 200° to 300° C. if desired as an additional parameter, or, alternatively, as an additional measure of the method. At such temperatures, the hydrogen does not yet have a reducing effect on, or, alternatively, for the oxide material.

The associated FIG. 1 shows a body 1 of the indicated material to be worked in accord with the present invention. On the surface 2 of this body 1 is an etched structure 3 to be manufactured. The laser beam 4 is impinged against surface portions of body 1 and is conducted along a controlled or preselected path which ultimately yields this etched structure 3. The etched structure 3 is, for example, a furrow. Preferably, the body 1 is moved relative to the laser beam 4 which is held constant with respect to its focus and its direction. However, sweeping of the laser beam focused spot can also be provided.

For the implementation of the method of the invention, the body 1 is situated in a housing or holder 5 in which the atmosphere is to be maintained, for example, hydrogen between 0 and about 1000 HPa. A means for optionally pre-heating the body 1 is referenced 7.

Modifications lying within the scope of the invention may be made. So an atmosphere can be applied which may be characterized as a vacuum. An Excimer-laser may be used instead of an above mentioned laser, Excimer-lasers are well known.

Having now fully described the invention, it will be apparent to one of ordinary skill in the art that many changes and modifications can be made thereto without departing from the spirit or scope of the invention as set forth herein.

I claim:

1. A method for etching structures in surface portions of a substrate body having a perovskite structure selected from the group consisting of dielectric oxide ceramics and dielectric single crystal oxides comprising moving such body relative to a laser processing beam impinged continuously against surface portions thereof along a controlled path while maintaining such surface portions in an atmosphere having a reducing effect for the material comprising said body at elevated temperatures.

2. The method of claim 1 wherein said body is selected from the group consisting of barium titanate, strontium titanate, and lead zirconate titanate, and said atmosphere contains hydrogen.

3. The method of claim 1 wherein said atmosphere contains hydrogen.

4. The method of claim 3 wherein the partial pressure of said hydrogen ranges between 0 and about 1000 HPa.

5. The method of claim 4 wherein said hydrogen partial pressure ranges from about 50 through 100 HPa.

6. The method of claim 1 wherein said body is preheated to a temperature above ambient.

7. The method of claim 1 wherein said laser processing beam comprises an argon laser.

8. The method of claim 1 wherein said laser processing beam comprises a krypton laser.

9. The method of claim 1 wherein said laser processing beam comprises a CO$_2$ laser.

10. The method of claim 1 wherein said laser processing beam comprises a Nd:YAG laser.

11. The method of claim 1 wherein said laser is an excimer laser.

12. The method of claim 1 wherein said atmosphere with reducing effect is a vacuum.

* * * * *